US012803517B2

(12) United States Patent
Teramoto

(10) Patent No.: US 12,803,517 B2
(45) Date of Patent: Nov. 17, 2026

(54) FILTER DEVICE

(71) Applicant: Murata Manufacturing Co., Ltd., Nagaokakyo (JP)

(72) Inventor: Masahiro Teramoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 19/027,904

(22) Filed: Jan. 17, 2025

(65) Prior Publication Data

US 2025/0309852 A1 Oct. 2, 2025

(30) Foreign Application Priority Data

Mar. 28, 2024 (JP) ................................ 2024-054262

(51) Int. Cl.

*H03H 7/00* (2006.01)
*H01F 17/00* (2006.01)
*H01F 27/29* (2006.01)
*H01F 27/32* (2006.01)
*H03H 7/01* (2006.01)
*H03H 1/00* (2006.01)

(52) U.S. Cl.

CPC ....... *H03H 7/0115* (2013.01); *H01F 17/0013* (2013.01); *H01F 27/29* (2013.01); *H01F 27/324* (2013.01); *H01F 2017/0026* (2013.01); *H03H 2001/0085* (2013.01)

(58) Field of Classification Search

CPC .......... H03H 7/0115; H03H 7/00; H03H 7/01; H03H 7/0107; H03H 7/0138; H03H 7/1741; H03H 7/1758; H03H 7/1775; H01F 2017/0026; H01F 2017/004; H01F 17/00; H01F 17/0013; H01F 27/324
USPC ................................................ 333/175, 185
See application file for complete search history.

(56) References Cited

U.S. PATENT DOCUMENTS

2016/0233844 A1 8/2016 Masuda
2017/0288633 A1 * 10/2017 Asada ................ H01P 1/20345
2022/0059279 A1 2/2022 Mikawa
2023/0238936 A1 7/2023 Tanaka

FOREIGN PATENT DOCUMENTS

JP 7021723 B1 2/2022
WO 2015064134 A1 5/2015
WO 2022097492 A1 5/2022

* cited by examiner

*Primary Examiner* — Stephen E. Jones
(74) *Attorney, Agent, or Firm* — Keating & Bennett, LLP

(57) ABSTRACT

A filter device includes an insulator, a first coil, a first outer electrode, a second coil, a second outer electrode, a first electrode pattern, a second electrode pattern, and a third outer electrode. The insulator includes a pair of main surfaces facing each other and a side surface connecting the main surfaces. The first coil is a spiral coil in the insulator. The second coil is a helical coil in the insulator and overlapping with at least a portion of the first coil when viewed in plan view from one main surface side.

20 Claims, 7 Drawing Sheets

FILTER DEVICE

CROSS REFERENCE TO RELATED APPLICATIONS

This application claims the benefit of priority to Japanese Patent Application No. 2024-054262 filed on Mar. 28, 2024. The entire contents of this application are hereby incorporated herein by reference.

BACKGROUND OF THE INVENTION

1. Field of the Invention

The present disclosure relates to filter devices.

2. Description of the Related Art

With advances in communication technologies in recent years, a communication terminal needs to support a plurality of frequency bands and a plurality of communication methods. For this reason, a communication terminal is provided with a filter device such as a low-pass filter where a pass band and an attenuation band for signals are set. For example, Japanese Patent No. 7021723 describes a filter device which is a low-pass filter including two coil elements connected in series to a signal path and a capacitor connected to the signal path by shunt connection.

SUMMARY OF THE INVENTION

However, when an apparatus where a filter device is mounted is reduced in size, the filter device also needs to be reduced in size. In a case where a filter device is an electronic component configured in a single insulator and is reduced in size, the two coil elements are closer together, and thus, the influence of magnetic field coupling between the two coil elements becomes larger. When the influence of the magnetic field coupling between the two coil elements is large, the filter device cannot achieve necessary attenuation characteristics.

Thus, example embodiments of the present invention provide filter devices each of which achieve necessary attenuation characteristics even if the filter device is reduced in size.

A filter device according to an example embodiment of the present disclosure includes an insulator including a pair of main surfaces facing each other and a side surface connecting the main surfaces, a first coil with a spiral shape in the insulator, a first outer electrode electrically connected to a first end of the first coil, a second coil with a helical shape in the insulator and overlapping with at least a portion of the first coil when viewed in plan view from one main surface side, a second outer electrode electrically connected to a first end of the second coil, a first electrode pattern in the insulator and electrically connected to a second end of the first coil and a second end of the second coil, a second electrode pattern facing the first electrode pattern and defining a first capacitor, and a third outer electrode electrically connected to the second electrode pattern.

By including the first coil with a spiral shape and the second coil with a helical shape, a filter device according to an example embodiment of the present disclosure mitigates the influence of magnetic field coupling between the two coil elements and thus achieves necessary attenuation characteristics even if the filter device is reduced in size.

The above and elements, features, steps, other characteristics and advantages of the present invention will become more apparent from the following detailed description of the example embodiments with reference to the attached drawings.

DETAILED DESCRIPTION OF THE EXAMPLE EMBODIMENTS

Figure 1:
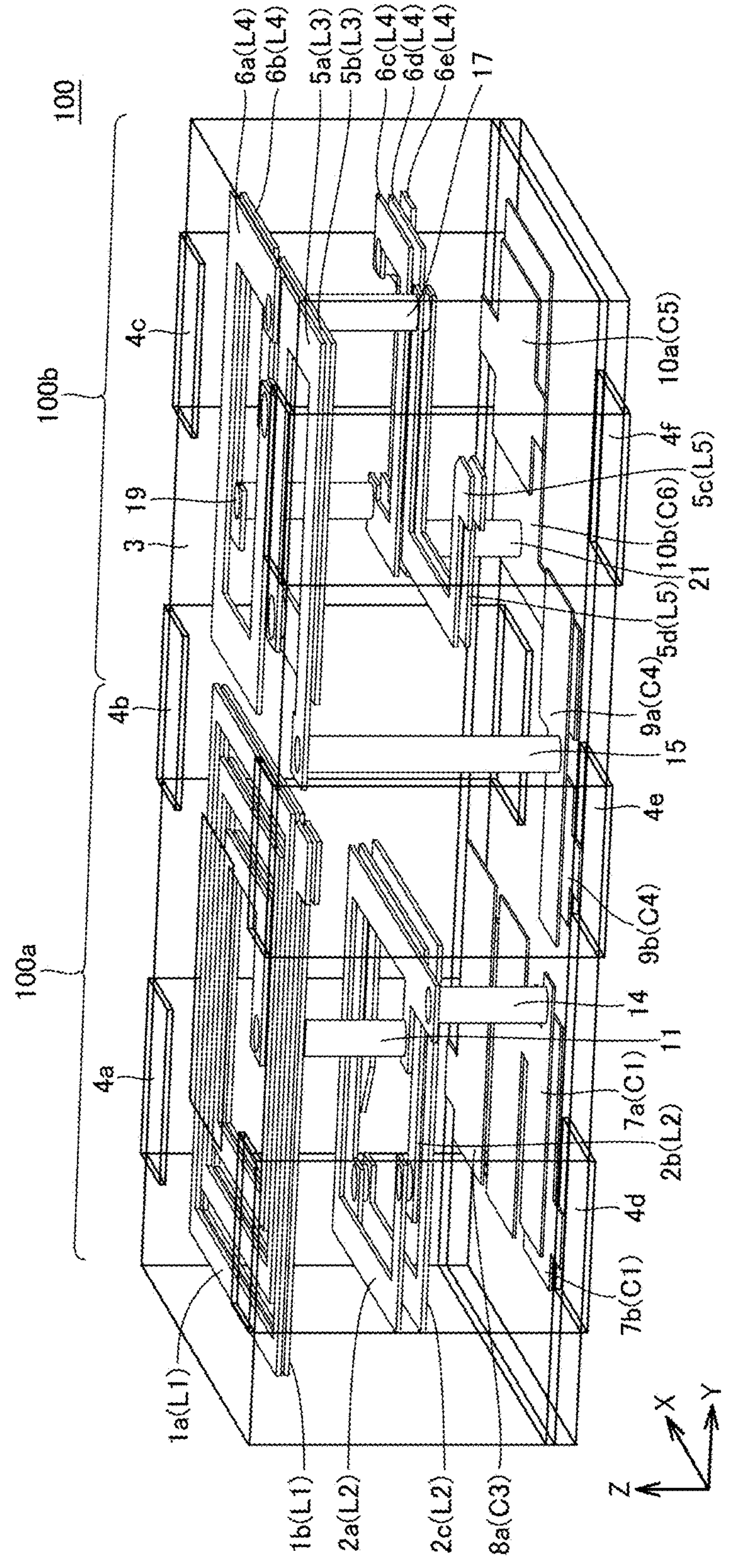
FIG. 1 is a perspective view of a filter device according to Example Embodiment 1 of the present invention.

With reference to the drawings, a diplexer is described in detail below as an example of a filter device according to an example embodiment. Note that throughout the drawings, the same or corresponding portions are denoted by the same reference numerals to omit repetitive descriptions. Also, the filter devices according to the example embodiments are not limited to a diplexer, as long as the filter devices according to the example embodiments include at least the configuration of the low-pass filter described below. Also, although a third-order T-type LC filter circuit is used as the low-pass filter described below, a fifth-order T-type LC filter circuit or a higher-order T-type LC filter circuit may also be used, for example.

Example Embodiment 1

Structure of Filter Device

Figure 2:
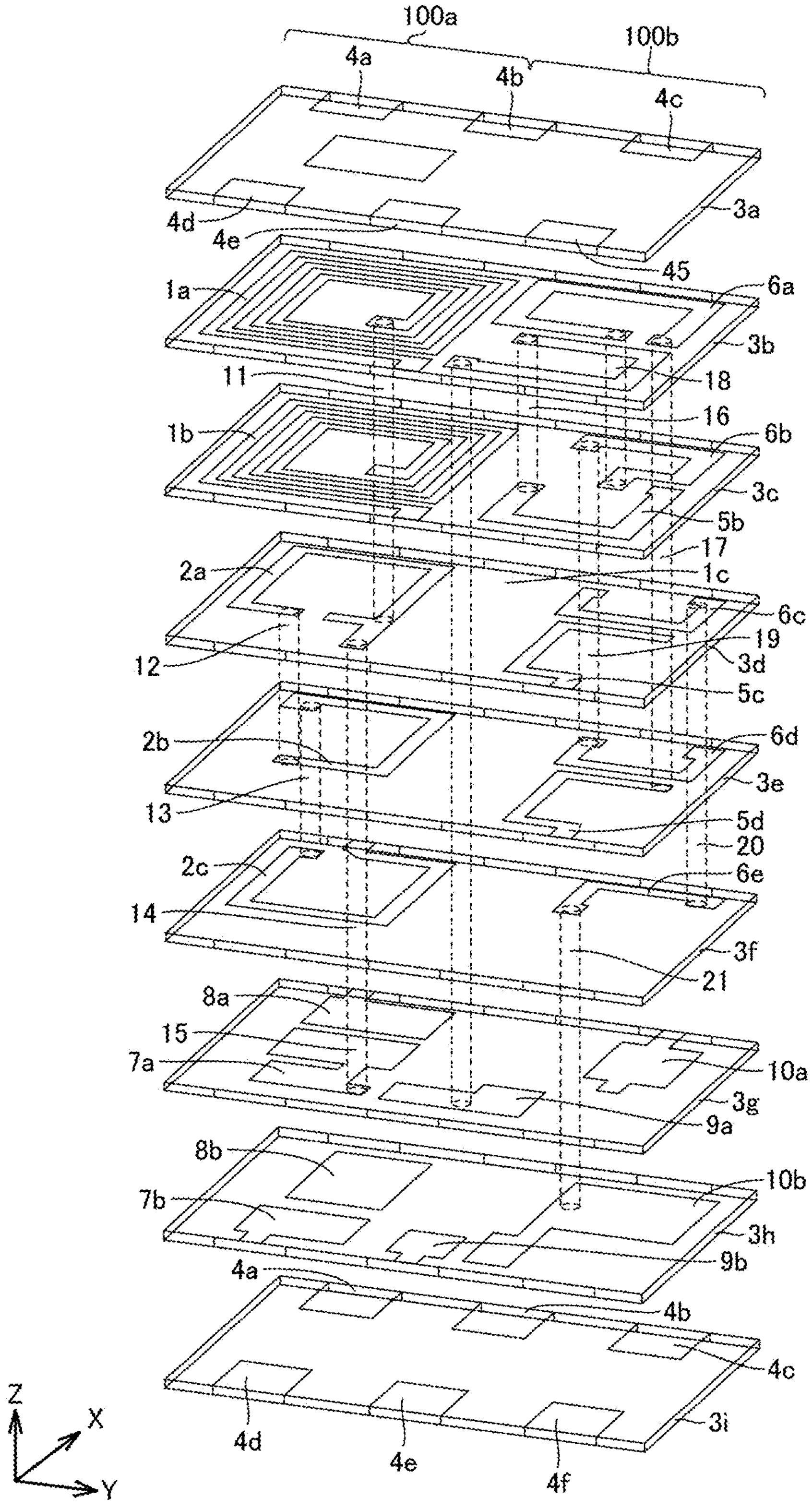
FIG. 2 is an exploded perspective view showing the configuration of the filter device according to Example Embodiment 1 of the present invention.
Figure 3:
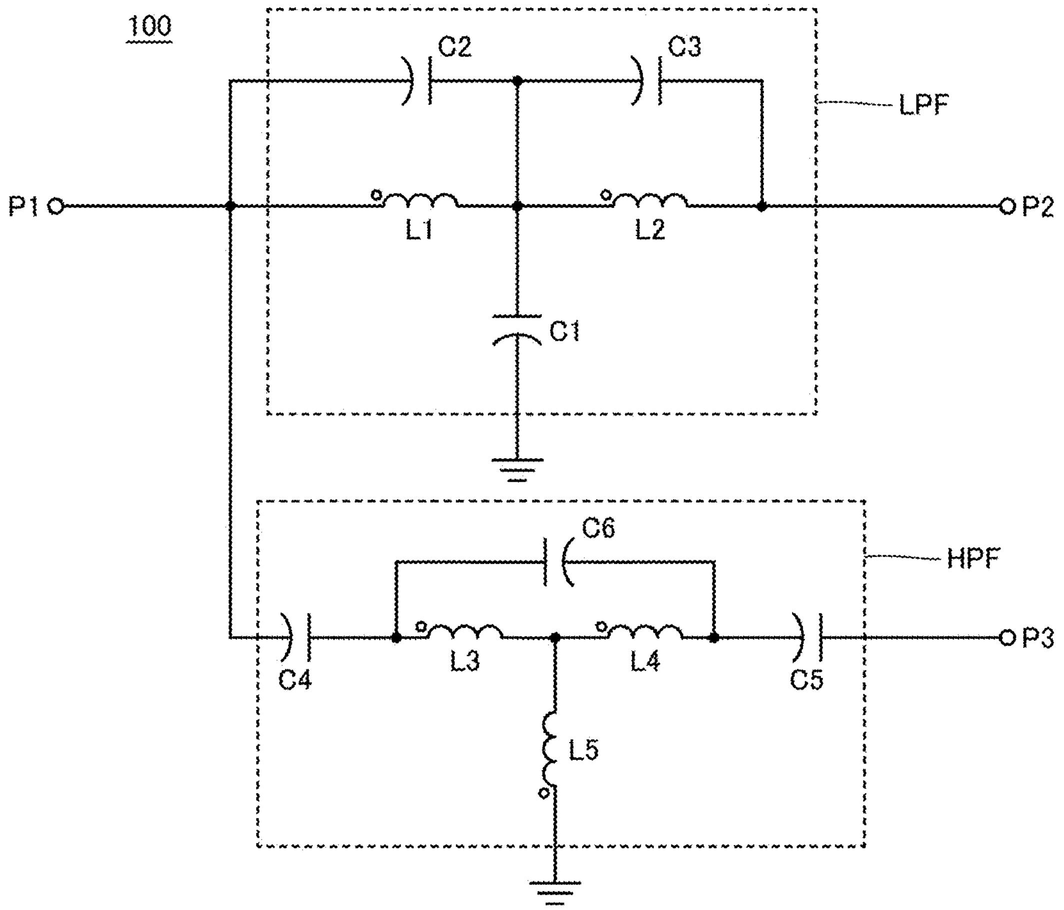
FIG. 3 is a circuit diagram of the filter device according to Example Embodiment 1 of the present invention.

First, a filter device according to Example Embodiment 1 is described with reference to the drawings. FIG. 1 is a perspective view of a filter device 100 according to Example Embodiment 1. FIG. 2 is an exploded perspective view showing the configuration of the filter device 100 according to Example Embodiment 1. FIG. 3 is a circuit diagram of the filter device 100 according to Example Embodiment 1. In FIGS. 1 and 2, the direction along the short side of the filter device 100 is an X-direction, the direction along the long side is a Y-direction, and the height direction is a Z-direction.

The filter device 100 is a diplexer combining two filter circuits with its low-band port being a low-pass filter and its high-band port being a high-pass filter. The filter device 100 is a chip component with a rectangular or substantially rectangular parallelepiped shape and includes an insulator 3 where a plurality of insulating substrates (insulator layers) are laminated. Note that the direction in which the insulating substrates are laminated is the Z-direction, and the direction pointed by the arrow indicates the upper layer direction. Also, the insulating substrates are made of, for example, an insulating material made mainly of borosilicate glass or a material such as alumina, zirconia, or an insulating resin such as a polyimide resin. Also, the interfaces between the plurality of insulating substrates of the insulator 3 may be unclear due to a treatment such as baking or solidification.

The insulator 3 includes a pair of main surfaces facing each other: the lower main surface in FIG. 1 is the mount surface, and this surface faces a circuit substrate. In the present example embodiment, the lower main surface in FIG. 1 is also referred to as a bottom surface, and the upper main surface in FIG. 1 is also referred to as a top surface. The insulator 3 has a first region 100*a* defining a low-pass filter and a second region 100*b* defining a high-pass filter when viewed in plan view from the top surface side among its main surface sides.

The first region 100*a* includes, as shown in a circuit diagram in FIG. 3, a low-pass filter LPF including a first coil element L1 and a second coil element L2 connected in series to a signal path connecting a first terminal P1 and a second terminal P2, and a first capacitor C1 connected to the signal path by shunt connection. As shown in FIGS. 1 and 2, in the first region 100*a* of the insulator 3, the first coil element L1, the second coil element L2, and the first capacitor C1 are disposed in this order from the top surface side to the bottom surface side of the insulator 3.

The first coil element L1 defines a spiral-shaped coil in the insulator 3 and includes a first coil pattern 1*a* and a first coil pattern 1*b* which are spiral-shaped, as shown in FIG. 2. The first coil pattern 1*a* is provided on an insulating substrate 3*b*, and the first coil pattern 1*b* is provided on an insulating substrate 3*c*. A first end of the first coil pattern 1*a* and a first end of the first coil pattern 1*b* are electrically connected to each other with an outer electrode 4*e* (a first outer electrode) interposed therebetween. Also, a second end of the first coil pattern 1*a* and a second end of the first coil pattern 1*b* are electrically connected to each other with a via conductor 11 interposed therebetween.

The first coil element L1 is configured such that the first coil pattern 1*a* and the first coil pattern 1*b* of the same shape are connected in parallel. Typically, to increase the inductance of a spiral-shaped coil, a larger area is required within the plane of the insulating substrate to allow for a larger number of turns. Thus, in the first coil element L1, the first coil pattern 1*a* and the first coil pattern 1*b* of the same shape are connected in parallel in order to achieve necessary inductance in the insulator 3 with limited space. Also, by the parallel connection of the first coil pattern 1*a* and the first coil pattern 1*b*, a second capacitor C2 connected in parallel to the first coil element L1 is configured as shown in the circuit diagram in FIG. 3.

The second coil element L2 defining a helical-shaped coil in the insulator 3 is disposed below the first coil element L1. As shown in FIG. 2, the second coil element L2 includes a second coil pattern 2*a*, a second coil pattern 2*b*, and a second coil pattern 2*c* which define a portion of the helical-shaped coil. The second coil pattern 2*a* is provided on an insulating substrate 3*d*, the second coil pattern 2*b* is provided on an insulating substrate 3*e*, and the second coil pattern 2*c* is provided on an insulating substrate 3*f*.

A first end of the second coil pattern 2*a* is electrically connected to the second ends of the first coil pattern 1*a* and the first coil pattern 1*b* with the via conductor 11 interposed therebetween, connecting the first coil element L1 and the second coil element L2 in series. A second end of the second coil pattern 2*a* is electrically connected to a first end of the second coil pattern 2*b* with a via conductor 12 interposed therebetween. A second end of the second coil pattern 2*b* is electrically connected to a first end of the second coil pattern 2*c* with a via conductor 13 interposed therebetween. A second end of the second coil pattern 2*c* is electrically connected to an outer electrode 4*a* (a second outer electrode). In this way, the helical-shaped second coil element L2 is defined by the second coil patterns 2*a* to 2*c* provided on the different insulating substrates 3*e* to 3*f* and electrically connected by the via conductors 12 and 13.

The first capacitor C1 is disposed below the second coil element L2. The first capacitor C1 includes an electrode pattern 7*a* (a first electrode pattern) and an electrode pattern 7*b* (a second electrode pattern) facing the electrode pattern 7*a*, as shown in FIG. 2. The electrode pattern 7*a* is provided on an insulating substrate 3*g*, and the electrode pattern 7*b* is provided on an insulating substrate 3*h*.

The electrode pattern 7*a* is electrically connected to the second coil pattern 2*a* with a via conductor 14 interposed therebetween. Because the second coil pattern 2*a* is also electrically connected to the first coil pattern 1*a* with the via conductor 11 interposed therebetween, the electrode pattern 7*a* is electrically connected to the first coil element L1 and the second coil element L2. The electrode pattern 7*b* is electrically connected to an outer electrode 4*d* (a third outer electrode).

In addition to the electrode pattern 7*a*, an electrode pattern 8*a* is provided on the insulating substrate 3*g*. The electrode pattern 8*a* is electrically connected to the outer electrode 4*a* and faces an electrode pattern 8*b* provided on the insulating substrate 3*h*. The electrode pattern 8*b* faces not only the electrode pattern 8*a*, but also the electrode pattern 7*a*. Thus, the electrode pattern 8*a* and the electrode pattern 8*b* define a third capacitor C3 shown in the circuit diagram in FIG. 3. Note that in the circuit diagram in FIG. 3, the first terminal P1 corresponds to the outer electrode 4*e* (the first outer electrode), the second terminal P2 corresponds to the outer electrode 4*a* (the second outer electrode), and GND corresponds to the outer electrode 4*d* (the third outer electrode).

The second region 100*b* includes, as shown in the circuit diagram in FIG. 3, a high-pass filter HPF including a fourth capacitor C4, a third coil element L3, a fourth coil element L4, and a fifth capacitor C5 which are connected in series to a signal path connecting the first terminal P1 and a third terminal P3, and a fifth coil element L5 connected to the signal path by shunt connection. As shown in FIGS. 1 and 2, in the second region 100*b* of the insulator 3, the fourth capacitor C4, the third coil element L3, the fourth coil element L4, the fifth capacitor C5, and the fifth coil element L5 are disposed in the insulator 3.

The fourth capacitor C4 includes an electrode pattern 9*a* (a fourth electrode pattern) and an electrode pattern 9*b* (a third electrode pattern) facing the electrode pattern 9*a*, as shown in FIG. 2. The electrode pattern 9*a* is provided on the insulating substrate 3*g*, and the electrode pattern 9*b* is provided on the insulating substrate 3*h*. The electrode pattern 9*a* is electrically connected to a third coil pattern 5*a* with a via conductor 15 interposed therebetween. The electrode pattern 9*b* is electrically connected to the outer electrode 4*e* (the first outer electrode).

The third coil element L3 includes the third coil pattern 5*a* and a third coil pattern 5*b* which define a portion of the helical-shaped coil, as shown in FIG. 2. The third coil pattern 5*a* is provided on the insulating substrate 3*b*, and the third coil pattern 5*b* is provided on the insulating substrate 3*c*.

A first end of the third coil pattern 5*a* is electrically connected to the electrode pattern 9*a* with the via conductor 15 interposed therebetween, connecting the fourth capacitor C4 and the third coil element L3 in series. A second end of the third coil pattern 5*a* is electrically connected to a first end of the third coil pattern 5*b* with a via conductor 16 interposed therebetween. In this way, the helical-shaped third coil element L3 is defined by the third coil patterns 5*a* and 5*b* provided on the different insulating substrates 3*b* and 3*c* and electrically connected by the via conductor 16.

The fourth coil element L4 includes a fourth coil pattern 6*a*, a fourth coil pattern 6*b*, a fourth coil pattern 6*c*, a fourth coil pattern 6*d*, and a fourth coil pattern 6*e* which define a portion of the helical-shaped coil, as shown in FIG. 2. The fourth coil pattern 6*a* is provided on the insulating substrate 3*b*, the fourth coil pattern 6*b* is provided on the insulating substrate 3*c*, the fourth coil pattern 6*c* is provided on the insulating substrate 3*d*, the fourth coil pattern 6*d* is provided on the insulating substrate 3*e*, and the fourth coil pattern 6*e* is provided on the insulating substrate 3*f*.

A first end of the fourth coil pattern 6*a* is electrically connected to a second end of the third coil pattern 5*b* with a via conductor 17 interposed therebetween, connecting the third coil element L3 and the fourth coil element L4 in series. A second end of the fourth coil pattern 6*a* is electrically connected to a first end of the fourth coil pattern 6*b* with a via conductor 18 interposed therebetween. A second end of the fourth coil pattern 6*b* is electrically connected to first ends of the fourth coil pattern 6*c* and the fourth coil pattern 6*d* with a via conductor 19 interposed therebetween. Second ends of the fourth coil pattern 6*c* and the fourth coil pattern 6*d* are electrically connected to a first end of the fourth coil pattern 6*e* with a via conductor 20 interposed therebetween. In this way, the helical-shaped fourth coil element L4 is defined by the fourth coil patterns 6*a* to 6*e* provided on the different insulating substrates 3*b* to 3*f* and electrically connected by the via conductors 18 to 20.

The fifth capacitor C5 includes an electrode pattern 10*a* (a sixth electrode pattern) and an electrode pattern 10*b* (a fifth electrode pattern) facing the electrode pattern 10*a*, as shown in FIG. 2. The electrode pattern 10*a* is provided on the insulating substrate 3*g*, and the electrode pattern 10*b* is provided on the insulating substrate 3*h*.

The electrode pattern 10*a* is electrically connected to an outer electrode 4*c* (a fifth outer electrode). The electrode pattern 10*b* is electrically connected to a second end of the fourth coil pattern 6*e* with a via conductor 21 interposed therebetween, connecting the fifth capacitor C5 and the fourth coil element L4 in series.

The fifth coil element L5 includes a fifth coil pattern 5*c* and a fifth coil pattern 5*d* which define a portion of the helical-shaped coil, as shown in FIG. 2. The fifth coil pattern 5*c* is provided on the insulating substrate 3*d*, and the fifth coil pattern 5*d* is provided on the insulating substrate 3*e*.

First ends of the fifth coil pattern 5*c* and the fifth coil pattern 5*d* are electrically connected to the third coil pattern 5*b* with the via conductor 17 interposed therebetween. The third coil pattern 5*b* is further electrically connected to the fourth coil pattern 6*a* with the via conductor 17 interposed therebetween. Thus, the fifth coil element L5 is electrically connected to the third coil element L3 and the fourth coil element L4. Second ends of the fifth coil pattern 5*c* and the fifth coil pattern 5*d* are electrically connected to an outer electrode 4*f* (a fourth outer electrode).

The electrode pattern 9*a* is provided on the insulating substrate 3*g*. The electrode pattern 9*a* faces not only the electrode pattern 9*b*, but also the electrode pattern 10*b*. Thus, the electrode pattern 9*a* and the electrode pattern 10*b* define a sixth capacitor C6 shown in the circuit diagram in FIG. 3. Note that in the circuit diagram in FIG. 3, the third terminal P3 corresponds to the outer electrode 4*c* (the fifth outer electrode), and GND corresponds to the outer electrode 4*f* (the fourth outer electrode).

The coil patterns and electrode patterns shown in FIG. 2 are formed on the insulating substrates 3*a* to 3*i* using printing techniques. Note that electrode patterns defining a portion of the outer electrodes 4*a* to 4*f* are provided on the insulating substrate 3*a* and the insulating substrate 3*i*. For the filter device 100, the plurality of insulating substrates 3*a* to 3*i* shown in FIG. 2 are laminated and are subjected to a treatment such as baking or solidification. The outer electrodes 4*a* to 4*f* are formed on the side surfaces of the insulator 3 which has been subjected to a treatment such as baking or solidification.

Characteristics of Filter Device

As shown in FIGS. 1 and 2, the filter device 100 includes the low-pass filter LPF where the first coil element L1 defining a spiral-shaped coil and the second coil element L2 defining a helical-shaped coil are connected in series and the first capacitor C1 is connected by shunt connection. In order to achieve a reduction in size, the first coil element L1 and the second coil element L2 are stacked vertically (in the Z-direction), which means a short distance between the two coil elements. However, when the influence of magnetic field coupling between two coil elements is large in a filter device, the filter device may fail to achieve necessary attenuation characteristics. Thus, in the filter device 100, the first coil element L1 is defined by a spiral-shaped coil. This enables mitigation of the influence of magnetic field coupling between the two coil elements, compared to a configuration where two helical-shaped coils are stacked vertically.

Unlike a helical-shaped coil, where coil wiring is wound helically, a spiral-shaped coil has a shape such that coil wiring is wound in the same plane. Thus, the strength of the magnetic field produced perpendicular to the plane in which the coil wiring is wound is weaker in a spiral-shaped coil than in a helical-shaped coil. Hence, the magnetic field coupling between the coil elements is weaker in a configuration where one of the coils is a spiral-shaped coil than in a configuration where two helical-shaped coils are stacked vertically.

Figure 4:
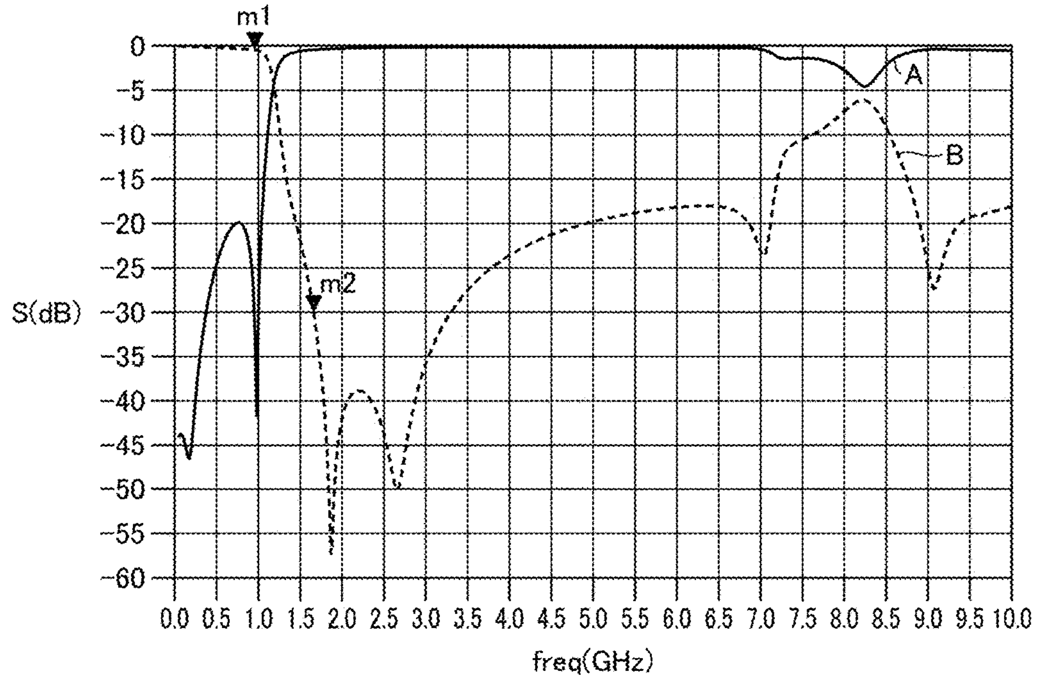
FIG. 4 is a graph showing the transmission characteristics of a low-pass filter in the filter device according to Example Embodiment 1 of the present invention.
Figure 5:
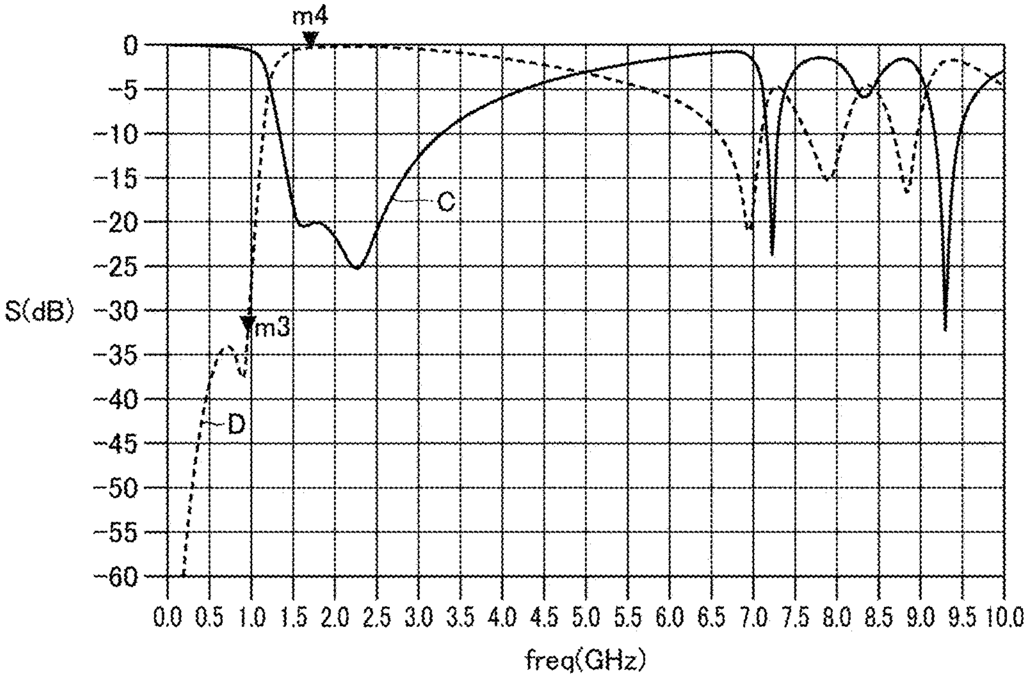
FIG. 5 is a graph showing the transmission characteristics of a high-pass filter in the filter device according to Example Embodiment 1 of the present invention.

FIG. 4 is a graph showing the transmission characteristics of the low-pass filter in the filter device 100 according to Example Embodiment 1. FIG. 5 is a graph showing the transmission characteristics of the high-pass filter in the filter device 100 according to Example Embodiment 1. In FIGS. 4 and 5, the horizontal axis represents frequency, and the vertical axis represents loss.

In FIG. 4, a graph A shows simulation results on the input-side return loss of the low-pass filter in the filter device 100, and a graph B shows simulation results on the insertion loss of the low-pass filter in the filter device 100. The graph B in FIG. 4 shows that the filter device 100 functions as the low-pass filter LPF having two attenuation poles: one near approximately 1.9 GHZ and the other near approximately 2.7 GHZ, for example. Also, in the graph B, for example, at mark m1, the insertion loss at a frequency of 0.96 GHz is −0.443 dB, which is small, whereas at mark m2, the insertion loss at a frequency of 1.71 GHz is −33.487 dB, which is large.

Meanwhile, in FIG. 5, a graph C shows simulation results on the input-side return loss of the high-pass filter in the filter device 100, and a graph D shows simulation results on the insertion loss of the high-pass filter in the filter device 100. In the graph D, at mark m3, for example, the insertion loss at a frequency of 0.96 GHz is −32.703 dB, which is large, whereas at mark m4, the insertion loss at a frequency of 1.71 GHz is −0.423 dB, which is small. In other words, this shows that the filter device 100 functions as the high-pass filter HPF which passes signals at a frequency of 1.71 GHZ.

In the filter device 100, when the influence of magnetic field coupling between the first coil element L1 and the second coil element L2 is large, the attenuation between the two attenuation poles shown in the graph B in FIG. 4 becomes large. However, in the graph B in FIG. 4, the attenuation between the two attenuation poles is not large, which shows that changing the first coil element L1 from a helical-shaped coil to a spiral-shaped coil enables mitigation of the influence of magnetic field coupling between the two coil elements.

From the perspective of mitigating the influence of magnetic field coupling between two coil elements, it is preferable that the axis of the spiral shape of the first coil element L1 and the axis of the helical shape of the second coil element L2 do not overlap when viewed in plan view from the top surface side of the insulator 3. The axis of the spiral shape of the first coil element L1 is the center axis of the spirally wound coil wiring, and the axis of the helical shape of the second coil element L2 is the center axis of the helically wound coil wiring.

Also, in a case where the filter device 100 is a diplexer, the inductance of the first coil element L1 is preferably larger than the inductance of the second coil element L2 so that the attenuation poles of the low-pass filter LPF do not appear in the pass band of the high-pass filter HPF. Note that being a spiral-shaped coil, the first coil element L1 needs to have longer coil wiring in order to have a larger inductance. However, when the first coil element L1 has longer coil wiring, the first coil element L1 occupies a larger area in the plane where the first coil element L1 is provided (the XY-plane in FIG. 1). For this reason, the coil wiring of the first coil element L1 is smaller in width than the coil wiring of the second coil element L2.

Although the spiral-shaped first coil element L1 is disposed on the first terminal P1 side, which is the input side, in the filter device 100 described above, the helical-shaped second coil element L2 may be disposed on the first terminal P1 side. Note that when the spiral-shaped first coil element L1 having a larger insertion loss is disposed on the first terminal P1 side and the helical-shaped second coil element L2 having a higher Q-value is disposed at a subsequent stage, the transmission characteristics of the low-pass filter improve further.

In the filter device 100 described above, as shown in FIGS. 1 and 2, the first coil element L1, the second coil element L2, and the first capacitor C1 are disposed in the first region 100*a* of the insulator 3 in this order from the top surface side to the bottom surface side of the insulator 3. In a case of a diplexer provided with a high-pass filter in the second region 100*b* of the insulator 3 like the filter device 100, the first coil element L1, the second coil element L2, and the first capacitor C1 are preferably disposed in the above order due to constraints such as the need to form the coil patterns of the coil elements of the low-pass filter and the coil patterns of the coil elements of the high-pass filter on the same insulating substrates. However, if there is no need to consider the above constraints, the first coil element L1, the second coil element L2, and the first capacitor C1 do not need to be disposed in this order from the top surface side to the bottom surface side of the insulator 3 and may be disposed in a different order.

Example Embodiment 2

In the filter device 100 according to Example Embodiment 1, of the first coil element L1 and the second coil element L2 defining the low-pass filter, the first coil element L1 is a spiral-shaped coil. When the first coil element L1 is a spiral-shaped coil, the first coil element L1 occupies a larger area in the plane including the first coil element L1 (the XY-plane in FIG. 1). Thus, when a filter device is reduced in size, it may be impossible to achieve an inductance necessary for the design with only spiral-shaped coils. For this reason, a filter device according to Example Embodiment 2 is configured such that the first coil element L1 includes a helical-shaped coil in addition to a spiral-shaped coil.

Figure 6:
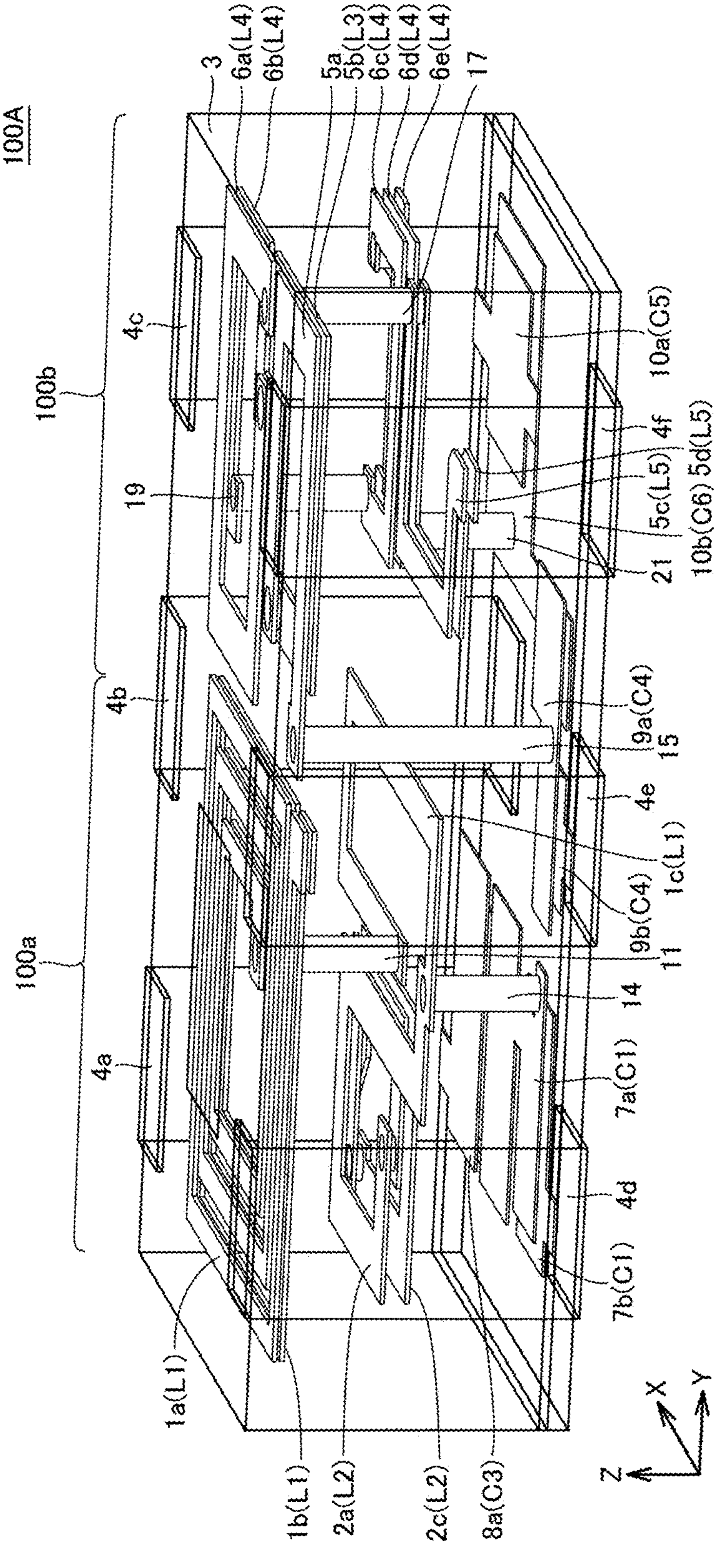
FIG. 6 is a perspective view of a filter device according to Example Embodiment 2 of the present invention.
Figure 7:
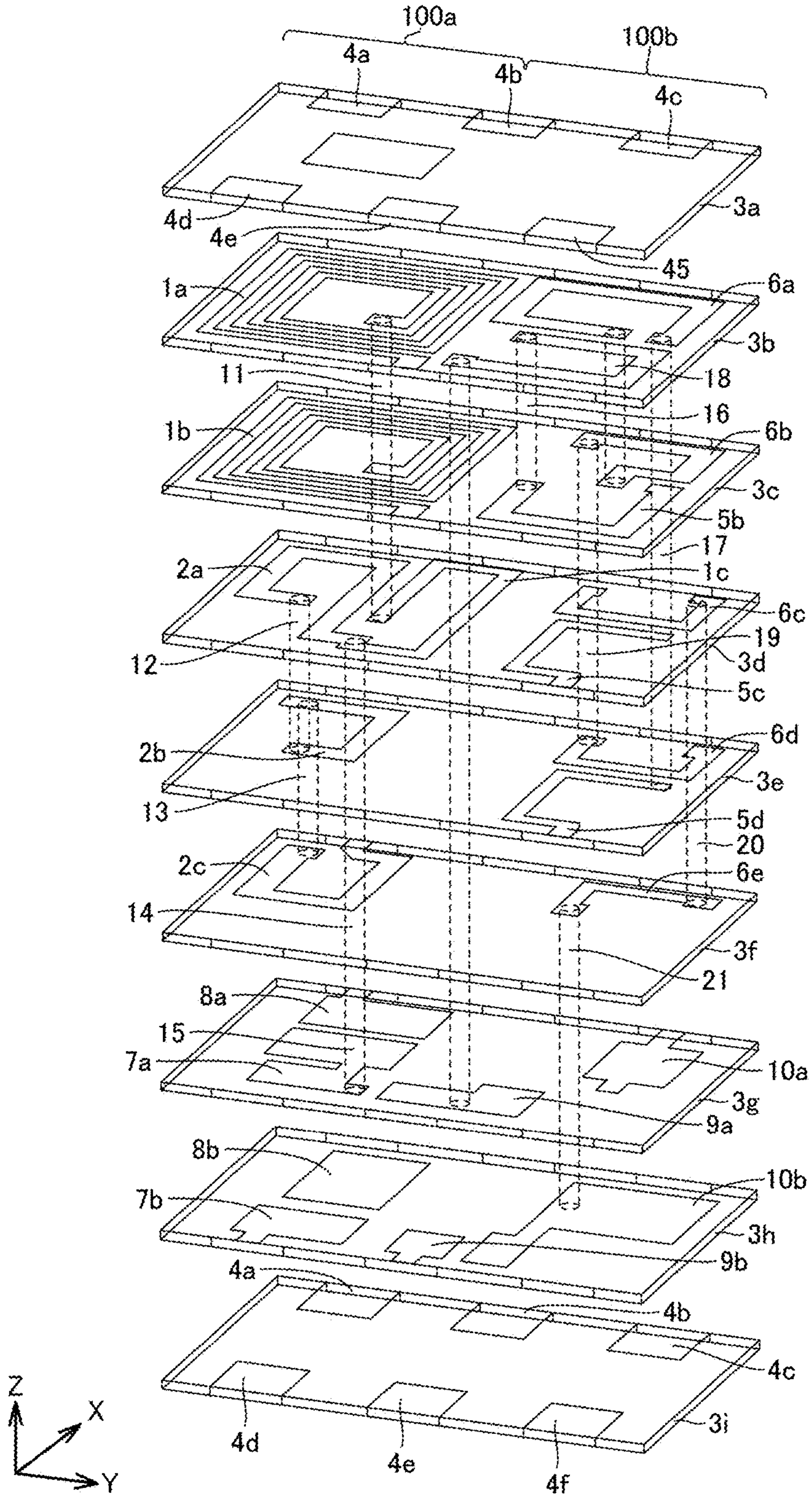
FIG. 7 is an exploded perspective view showing the configuration of the filter device according to Example Embodiment 2 of the present invention.

The filter device according to Example Embodiment 2 is described with reference to the drawings. FIG. 6 is a perspective view of a filter device 100A according to Example Embodiment 2. FIG. 7 is an exploded perspective view showing the configuration of the filter device 100A according to Example Embodiment 2. Note that components of the filter device 100A shown in FIGS. 6 and 7 that are the same as those of the filter device 100 shown in FIGS. 1 and 2 are denoted by the same reference numerals and are not described in detail repetitively.

The filter device 100A is a diplexer combining two filter circuits with its low-band port being a low-pass filter and its high-band port being a high-pass filter. The insulator 3 includes the first region 100*a* defining the low-pass filter and the second region 100*b* defining the high-pass filter, when viewed in plan view from the top surface side among its main surface sides.

As shown in FIGS. 6 and 7, in the first region 100*a* of the insulator 3, the first coil element L1, the second coil element L2, and the first capacitor C1 are disposed in this order from the top surface side to the bottom surface side of the insulator 3.

In the insulator 3, the first coil element L1 includes, in addition to a first portion defining a spiral-shaped coil, a second portion defining a helical-shaped coil. As shown in FIG. 7, the first portion of the first coil element L1 includes the first coil pattern 1*a* and the first coil pattern 1*b* which are spiral-shaped. The first coil pattern 1*a* is provided on the insulating substrate 3*b*, and the first coil pattern 1*b* is provided on the insulating substrate 3*c*. The first end of the first coil pattern 1*a* and the first end of the first coil pattern 1*b* are electrically connected to each other with the outer electrode 4*e* (the first outer electrode) interposed therebetween. Also, the second end of the first coil pattern 1*a* and the second end of the first coil pattern 1*b* are electrically connected to each other with the via conductor 11 interposed therebetween.

As shown in FIG. 7, the second portion of the first coil element L1 includes a helical-shaped first coil pattern 1*c*. The first coil pattern 1*c* is provided on the insulating substrate 3*d*. A first end of the first coil pattern 1*c* is electrically connected to the second end of the first coil pattern 1*a* and the second end of the first coil pattern 1*b* with the via conductor 11 interposed therebetween. A second end of the first coil pattern 1*c* is electrically connected to the first end of the second coil pattern 2*a* of the second coil element L2 provided on the same insulating substrate 3*d*.

The first coil pattern 1*c* and the second coil pattern 2*a* are provided on the same insulating substrate 3*d*. The first coil pattern 1*c* (the second portion of the first coil element L1) is preferably provided at a position closer to the second region 100*b* than the second coil element L2 is. This enables the second coil element L2 to mitigate the influence of the magnetic fields from the coil elements of the high-pass filter and thus improves the transmission characteristics of the low-pass filter. If the influence of the magnetic fields of the coil elements of the high-pass filter is small, the second coil element L2 may be provided at a position closer to the second region 100*b* than the second portion of the first coil element L1 is.

Also, defining the first coil pattern 1*c* and the second coil pattern 2*a* on the same insulating substrate 3*d* enables the axis of the spiral shape (the first portion) of the first coil element L1 to be more offset from the axis of the helical shape of the second coil element L2 when viewed in plan view from the top surface side. Note that the first coil pattern 1*c* does not need to be provided on the same insulating substrate 3*d* as the second coil pattern 2*a* and may be provided on a different insulating substrate.

Further, the second end of the first coil pattern 1*c* is electrically connected to the electrode pattern 7*a* with the via conductor 14 interposed therebetween. Because the second end of the first coil pattern 1*c* is also electrically connected to the first end of the second coil pattern 2*a*, the electrode pattern 7*a* is electrically connected to the first coil element L1 and the second coil element L2.

In this way, because the first coil element L1 includes the helical-shaped second portion (the first coil pattern 1*c*) in addition to the spiral-shaped first portion (the first coil pattern 1*a* and the first coil pattern 1*b*), an inductance necessary for the design can be achieved even if the filter device 100A is reduced in size.

Figure 8:
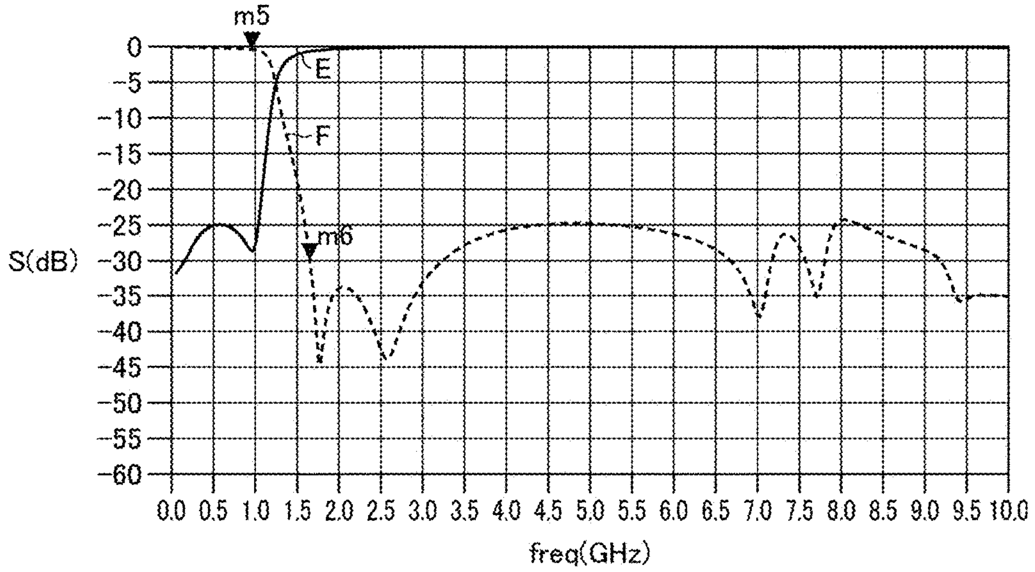
FIG. 8 is a graph showing the transmission characteristics of a low-pass filter in the filter device according to Example Embodiment 2 of the present invention.
Figure 9:
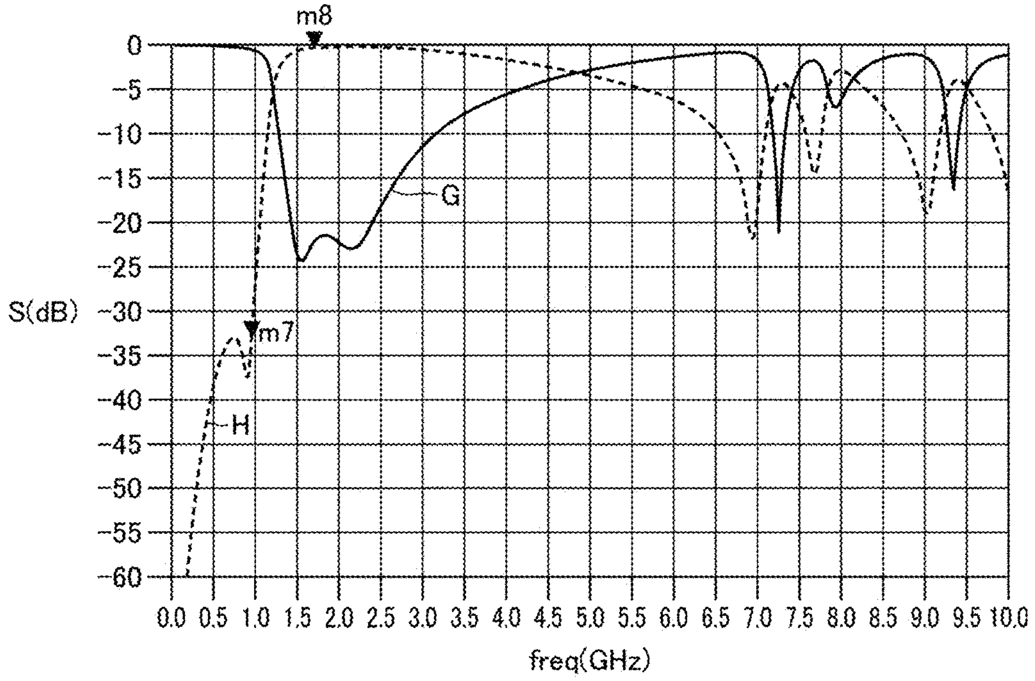
FIG. 9 is a graph showing the transmission characteristics of a high-pass filter in the filter device according to Example Embodiment 2 of the present invention.

FIG. 8 is a graph showing the transmission characteristics of the low-pass filter in the filter device 100A according to Example Embodiment 2. FIG. 9 is a graph showing the transmission characteristics of the high-pass filter in the filter device 100A according to Example Embodiment 2. In FIGS. 8 and 9, the horizontal axis represents frequency, and the vertical axis represents loss.

In FIG. 8, a graph E shows simulation results on the input-side return loss of the low-pass filter in the filter device 100A, and a graph F shows simulation results on the insertion loss of the low-pass filter in the filter device 100A. The graph F in FIG. 8 shows that the filter device 100A functions as the low-pass filter LPF having two attenuation poles: one near approximately 1.8 GHZ and the other near approximately 2.6 GHZ, for example. Also, in the graph F, at mark m5, for example, the insertion loss at a frequency of 0.96 GHz is −0.428 dB, which is small, whereas at mark m6, the insertion loss at a frequency of 1.71 GHz is −36.858 dB, which is large.

The filter device 100A is configured such that the first coil element L1 includes the helical-shaped second portion (the first coil pattern 1*c*) in addition to the spiral-shaped first portion (the first coil pattern 1*a* and the first coil pattern 1*b*). Thus, the first coil element L1 of the filter device 100A has a larger inductance than that of the filter device 100, which reduces the insertion loss at a frequency of 0.96 GHz from −0.443 dB (FIG. 4) to −0.428 dB (FIG. 8), for example.

Meanwhile, in FIG. 9, a graph G shows simulation results on the input-side return loss of the high-pass filter in the filter device 100A, and a graph H shows simulation results on the insertion loss of the high-pass filter in the filter device 100A. In the graph H, at mark m7, for example, the insertion loss at a frequency of 0.96 GHz is −33.139 dB, which is large, whereas at mark m8, the insertion loss at a frequency of 1.71 GHz is −0.417 dB, which is small. In other words, this shows that the filter device 100A functions as the high-pass filter HPF which passes signals at a frequency of 1.71 GHZ.

The example embodiments disclosed herein should be construed as exemplary and not as limiting at all. The scope of the present invention is defined not by the description given above, but by the claims, and all changes that come within the meaning and range of equivalency of the claims are intended to be embraced therein.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:

an insulator including a pair of main surfaces facing each other and a side surface connecting the main surfaces;

a first coil with a spiral shape in the insulator;

a first outer electrode electrically connected to a first end of the first coil;

a second coil with a helical shape in the insulator and overlapping with at least a portion of the first coil when viewed in plan view from one main surface side;

a second outer electrode electrically connected to a first end of the second coil;

a first electrode pattern in the insulator and electrically connected to a second end of the first coil and a second end of the second coil;

a second electrode pattern facing the first electrode pattern and defining a first capacitor; and a third outer electrode electrically connected to the second electrode pattern.

2. The filter device according to claim 1, wherein an inductance of the first coil is larger than an inductance of the second coil.

3. The filter device according to claim 1, wherein an axis of the first coil does not overlap with an axis of the second coil when viewed in plan view from one main surface side.

4. The filter device according to claim 1, wherein the first coil includes, in addition to a first portion defining the spiral shaped coil, a second portion defining a portion of the helical shaped coil.

5. The filter device according to claim 4, wherein the insulator includes a plurality of insulating substrates;

the first portion of the first coil and the second coil are on different ones of the plurality of insulating substrates; and the second portion of the first coil and a portion of the second coil are on a same one of the plurality of insulating substrates.

6. The filter device according to claim 1, wherein the first coil, the second coil, and the first capacitor are positioned in this order from one main surface side to another main surface side.

7. The filter device according to claim 1, wherein the insulator includes a first region defining a low-pass filter and a second region defining a high-pass filter when viewed in plan view from one main surface side, the first region including the first coil, the second coil, and the first capacitor;

the second region includes:

a third electrode pattern electrically connected to the first outer electrode;

a fourth electrode pattern facing the third electrode pattern and defining a second capacitor;

a third coil with a helical shape in the insulator and including a first end electrically connected to the fourth electrode pattern;

a fourth coil with a helical shape in the insulator and including a first end electrically connected to a second end of the third coil;

a fourth outer electrode electrically connected to a second end of the fourth coil;

a fifth coil with a helical shape in the insulator and including a first end electrically connected to a second end of the third coil;

a fifth electrode pattern in the insulator and electrically connected to a second end of the fifth coil;

a sixth electrode pattern facing the fifth electrode pattern and defining a third capacitor; and a fifth outer electrode electrically connected to the sixth electrode pattern.

8. The filter device according to claim 7, wherein the first coil includes, in addition to a first portion defining the spiral shaped coil, a second portion defining a portion of the helical shaped second coil; and the second portion is closer to the second region than is the second coil.

9. The filter device according to claim 7, wherein the third coil includes two coil patterns provided on different insulating substrates.

10. The filter device according to claim 7, wherein the fourth coil includes five coil patterns provided on different insulating substrates.

11. The filter device according to claim 7, further comprising a fourth capacitor connected to the third coil in series.

12. The filter device according to claim 11, further comprising a fifth capacitor connected to the fourth coil in series.

13. The filter device according to claim 12, further comprising a sixth capacitor.

14. The filter device according to claim 1, wherein the filter device defines a low pass filter.

15. The filter device according to claim 14, wherein the low pass filter forms a third-order T-type configuration LC filter circuit or a fifth-order T-configuration filter circuit.

16. The filter device according to claim 14, wherein the filter device defines a high pass filter.

17. The filter device according to claim 1, wherein the filter device is a chip component with a rectangular or substantially rectangular parallelepiped shape.

18. The filter device according to claim 1, wherein the first coil includes two coil patterns with a same shape connected in parallel.

19. The filter device according to claim 1, wherein the second coil includes three coil patterns provided on different insulating substrates.

20. A diplexer comprising the filter device according to claim 1.

* * * * *